United States Patent
He et al.

(10) Patent No.: US 11,662,385 B2
(45) Date of Patent: May 30, 2023

(54) METHOD AND SYSTEM OF LITHIUM BATTERY STATE OF CHARGE ESTIMATION BASED ON SECOND-ORDER DIFFERENCE PARTICLE FILTERING

(71) Applicant: WUHAN UNIVERSITY, Hubei (CN)

(72) Inventors: Yigang He, Hubei (CN); Yuan Chen, Hubei (CN); Zhong Li, Hubei (CN); Liulu He, Hubei (CN)

(73) Assignee: WUHAN UNIVERSITY, Hubei (CN)

( * ) Notice: Subject to any disclaimer, the term of this patent is extended or adjusted under 35 U.S.C. 154(b) by 0 days.

(21) Appl. No.: 17/509,068

(22) Filed: Oct. 25, 2021

(65) Prior Publication Data

US 2022/0196745 A1 Jun. 23, 2022

(30) Foreign Application Priority Data

Dec. 18, 2020 (CN) .......................... 202011501757.0

(51) Int. Cl.
*G01R 31/36* (2020.01)
*G01R 31/388* (2019.01)
*G01R 31/367* (2019.01)

(52) U.S. Cl.
CPC ....... *G01R 31/3648* (2013.01); *G01R 31/367* (2019.01); *G01R 31/388* (2019.01)

(58) Field of Classification Search
CPC .......................... G01R 31/3648; G01R 31/388
USPC ......................................................... 702/63
See application file for complete search history.

(56) References Cited

U.S. PATENT DOCUMENTS

| 2014/0049226 A1* | 2/2014 | Mao | G01R 31/392 |
| | | | 702/63 |
| 2014/0244225 A1* | 8/2014 | Balasingam | G01R 31/3835 |
| | | | 703/2 |
| 2015/0349385 A1* | 12/2015 | Hu | G01R 31/367 |
| | | | 702/63 |

(Continued)

OTHER PUBLICATIONS

Yigang et al., "Remaining Useful Life Prediction and State of Health Diagnosis of Lithium-Ion Battery Based on Second-Order Central Difference Particle Filter," Feb. 17, 2020, IEEE, vol. 8, pp. 37305-37313. (Year: 2020).*

*Primary Examiner* — Ricky Go
(74) *Attorney, Agent, or Firm* — JCIPRNET

(57) ABSTRACT

A method and a system of lithium battery state of charge (SOC) estimation based on second-order difference particle filtering belonging to the technical field of battery management are provided. The method includes the following steps: building a second-order RC battery model of a lithium battery; performing model parameterization by using a least squares algorithm with a forgetting factor; and generating an importance density function through a second-order central difference Kalman filtering (SCDKF) algorithm, improving a particle filtering algorithm to obtain a second-order difference particle filtering (SCDPF) algorithm, and performing SOC estimation on a lithium battery by using the SCDPF. The estimation method provided by the disclosure is accurate and has greater estimation accuracy than an unscented particle filtering algorithm (UPF), an unscented Kalman filtering algorithm (UKF), and an extended Kalman filtering algorithm (EKF). An SOC value of the lithium battery may thus be accurately estimated.

15 Claims, 8 Drawing Sheets

(56) References Cited

U.S. PATENT DOCUMENTS

2018/0024200 A1* 1/2018 Hiwa ................ G01R 31/3842
  702/63
2019/0235027 A1* 8/2019 Sugiura .............. G01R 31/3842

* cited by examiner

METHOD AND SYSTEM OF LITHIUM BATTERY STATE OF CHARGE ESTIMATION BASED ON SECOND-ORDER DIFFERENCE PARTICLE FILTERING

CROSS REFERENCE TO RELATED APPLICATION

This application claims the priority benefit of China design patent application serial no. 202011501757.0 filed Dec. 18, 2020. The entirety of the above-mentioned patent application is hereby incorporated by reference herein and made a part of the specification.

BACKGROUND

Technical Field

The disclosure relates to the technical field of battery management, in particular, relates to a method and a system of lithium battery state of charge (SOC) estimation based on second-order difference particle filtering, and specifically, relates to model parameterization by building a second-order RC equivalent circuit model and adopting a least squares algorithm with a forgetting factor and improvement of a particle filtering algorithm to obtain a second-order difference particle filtering algorithm to estimate the SOC of a battery.

Description of Related Art

Regarding electric vehicles, reduced noise, energy saving, environmental protection, and no emission of harmful gases are some of the advantages that electric vehicles can offer. However, electric vehicles also exhibit several disadvantages such as high battery costs, short recharge mileage, long recharging time, and insufficient popularity of charging piles. As a result, at present, actual applications and promotion of electric vehicles have encountered difficulties. It can be said that the development of electric vehicles is limited by the development of related technologies for power battery systems, and therefore, related research on the battery management systems (BMS) has become a core issue in the development of electric vehicles. The accurate estimation of the state of charge (SOC), used for evaluating the remaining available power of a battery, is one of the core technologies of BMS. The SOC of the battery cannot be directly measured when a vehicle is running, and it needs to be calculated indirectly through data such as battery voltage, current, and temperature. Through the SOC estimation of the battery, real-time prediction of the remaining available power of the battery may be achieved, and in this way, a reasonable traveling plan may be conveniently formulated, and normal operation of an electric vehicle is ensured.

The PF algorithm is a recursive nonlinear non-Gaussian filtering algorithm based on Bayesian estimation. The probability distribution of the system state is approximated by the Monte Carlo method, that is, the probability density function may be approximated and obtained by a large number of sample points (particles) with weights. Through continuous iteration between particles, the weight of the particles is adjusted, and the state and observation output of the system are calculated through the weighted average value of the particles. The PF algorithm provides a good estimation effect. However, in Monte Carlo sampling, when the prior probability density is selected to act as the importance density function to approximate the unknown posterior probability density, this approximation has errors. With the increase of the number of iterations, the diversity of particles may disappear, and the phenomenon of particle degradation may appear, which will lead to the failure of the filtering algorithm.

SUMMARY

In view of the above defects or improvement requirements of the related art, the disclosure provides a method and system of lithium battery state of charge (SOC) estimation based on second-order difference particle filtering capable of performing SOC estimation on a lithium battery.

To realize the above purpose, according to one aspect of the disclosure, the disclosure provides a method of lithium battery SOC estimation based on second-order difference particle filtering. The method includes the following steps.

(1) A second-order RC battery model of a lithium battery is built.

(2) According to the second-order RC battery model of the lithium battery, model parameterization is performed by using a least squares algorithm with a forgetting factor.

(3) An importance density function is generated through a second-order central difference Kalman filtering (SCDKF) algorithm.

(4) A particle filtering algorithm is improved according to the importance density function to obtain a second-order difference particle filtering (SCDPF) algorithm, and SOC estimation is performed on a lithium battery by using the SCDPF.

In some optional embodiments, step (1) further includes the following.

A state formula of the discretized battery second-order RC model is:

$$x_{k+1} = A \cdot x_k + B \cdot I(k),$$

$$A = \begin{bmatrix} \exp\left(-\frac{T}{\tau_{ct}}\right) & 0 & 0 \\ 0 & \exp\left(-\frac{T}{\tau_{wb}}\right) & 0 \\ 0 & 0 & 1 \end{bmatrix},$$

$$B = \begin{bmatrix} R_{ct} \cdot \left(1 - \exp\left(-\frac{T}{\tau_{ct}}\right)\right) \\ R_{wb} \cdot \left(1 - \exp\left(-\frac{T}{\tau_{wb}}\right)\right) \\ -\frac{T}{C} \end{bmatrix},$$

$$x_k = \begin{bmatrix} U_{ct}(k) \\ U_{wb}(k) \\ SOC(k) \end{bmatrix},$$

$$x_{k+1} = \begin{bmatrix} U_{ct}(k+1) \\ U_{wb}(k+1) \\ SOC(k+1) \end{bmatrix},$$

where T is a sampling time interval, k is sampling time, $R_{ac}$ is ohmic resistance, $R_{ct}$ is charge transfer resistance, $R_{wb}$ is diffusion resistance, $C_{ct}$ is charge transfer capacitance, $C_{wb}$ is diffusion capacitance, $U_{ocv}$ is a circuit open circuit voltage, $U_{ct}$ is a voltage at both terminals of a $R_{ct}C_{ct}$ network, $U_{wb}$ is a voltage at both terminals of a $R_{wb}C_{wb}$ network, $U_t$ is a voltage at a model output terminal, I is a current at present, $\tau_{ct}$ is a time constant of the $R_{ct}C_{ct}$ network, $\tau_{wb}$ is a time constant of the $R_{wb}C_{wb}$ network, $\tau_{ct}=R_{ct}C_{ct}$, $T_{wb}=R_{wb}C_{wb}$, and C is battery capacitance.

A predicted terminal voltage of a battery after discretization is:

$$y(k+1) = C \cdot x_k + D \cdot I(k),$$
$$C = \left[-1 \; -1 \; \frac{\partial U_{ocv}}{\partial SOC}\right],$$
$$D = -R_{ac},$$

where y(k+1) is the predicted terminal voltage of the battery at time k+1.

In some optional embodiments, step (2) further includes the following step.

A terminal voltage of the second-order RC battery model of the lithium battery is written in a least squares form: $y(k)=\varphi(k)\theta^T+e(k)$, where $\varphi(k)=[y(k-1)y(k-2)I(k)I(k-1)I(k-2)]$, e(k) is a sampling error of a sensor at time k, and a parameter matrix of the second-order RC battery model of the lithium battery is identified as $\theta=[\theta_1\theta_2\theta_3\theta_4\theta_5]$, where $y(k)=\theta_1 y(k-1)+\theta_2 y(k-2)+\theta_3 I(k)+\theta_4 I(k-1)+\theta_5 I(k-2)$.

Parameter identification is performed on the parameter θ through the least squares algorithm with a forgetting factor $$\begin{cases} \hat{\theta}(k) = \hat{\theta}(k-1) + K(k)[y(k) - \varphi^T(k)\hat{\theta}(k-1)] \\ K(k) = P(k-1)\varphi(k)[\lambda + \varphi^T(k)P(k-1)\varphi(k)]^{-1}, \\ P(k) = \frac{1}{\lambda}[I - K(k)\varphi^T(k)]P(k-1) \end{cases}$$

λ is the forgetting factor, and $\hat{\theta}$ is an estimated value of θ.

In some optional embodiments, the model parameters $R_{ac}$, $R_{ct}$, $R_{wb}$, $\tau_{ct}$, and $\tau_{wb}$ are obtained through $$\begin{cases} R_{ac} = \frac{\theta_3 - \theta_4 + \theta_5}{1 + \theta_1 - \theta_2} \\ \tau_{ct}\tau_{wb} = \frac{T^2(1 + \theta_1 - \theta_2)}{4(1 - \theta_1 - \theta_2)} \\ \tau_{ct} + \tau_{wb} = \frac{T(1 + \theta_2)}{1 - \theta_1 - \theta_2} \\ R_{ac} + R_{ct} + R_{wb} = \frac{\theta_3 + \theta_4 + \theta_5}{1 - \theta_1 - \theta_2} \\ R_{ac}\tau_{wb} + R_{ac}\tau_{ct} + R_{ct}\tau_{wb} + R_{wb}\tau_{ct} = \frac{T(\theta_3 - \theta_5)}{1 - \theta_1 - \theta_2} \end{cases}$$

In some optional embodiments, step (3) further includes the following step.

A state estimated value $\hat{x}_k^{(i)}$ of particles $x_k$ is determined by $\hat{x}_k^{(i)} = \bar{x}_k^{(i)} + K_k^{(i)}(y_k - \bar{y}_k^{(i)})$, and a covariance estimation $\hat{P}_k^{(i)}$ is determined by $\hat{P}_k^{(i)} = \hat{S}_x^{(i)}(k)\hat{S}_x^{(i)}(k)^T$, where $\bar{x}_k^{(i)}$ represents a one-step predicted value of the particles $x_k$, $K_k^{(i)}$ represents a Kalman gain, y(k) represents a terminal voltage of the battery, $\bar{y}_k^{(i)}$ represents a predicted output voltage value, $\hat{S}_x^{(i)}(k)$ represents a composite matrix of a predicted state error mean square matrix, k represents time, and i is a number of particles.

In some optional embodiments, step (3) further includes the following steps.

Four square root decomposition operators are obtained through Cholesky decomposition, where the four square root decomposition operators are a system process noise covariance matrix, a system observation noise covariance matrix, a system prediction covariance, and a system estimation covariance.

A first-order difference matrix and a second-order difference matrix of each particle are obtained through the square root decomposition operators.

The one-step predicted value, the composite matrix of the predicted state error mean square matrix, and a composite matrix of a predicted mean square error matrix of each particle are obtained through the first-order difference matrix and the second-order difference matrix of each particle.

A rectangular matrix obtained from the composite matrix of the predicted state error mean square matrix is converted into a Cholesky factor-square matrix of the predicted state error mean square matrix by using QR decomposition, and a predicted error covariance matrix is updated from the Cholesky factor-square matrix of the predicted state error mean square matrix.

The QR decomposition of composite matrix is performed on the composite matrix of the predicted mean square error matrix to obtain a Cholesky factor-square matrix of the predicted mean square error matrix.

A mutual prediction error mean square matrix of a system is obtained from the Cholesky factor-square matrix of the predicted state error mean square matrix and the first-order difference matrix, the Kalman gain is obtained from the mutual prediction error mean square matrix of the system, and the estimated value of the particles is updated by the Kalman gain.

A Cholesky factor of an estimated error covariance matrix is obtained by using the QR decomposition, and the covariance estimation is updated by the Cholesky factor of the estimated error covariance matrix.

In some optional embodiments, step (4) further includes the following steps.

Importance sampling $x_k^{(i)} \sim N(\hat{x}_k^{(i)}; \hat{P}_k^{(i)})$ is performed on the particles by using $\hat{x}_k^{(i)}$ and $\hat{P}_k^{(i)}$ to obtain the second-order difference particle filtering (SCDPF) algorithm.

Standardized importance weight distribution is performed by $$W_k^i = (1/\sqrt{2\pi}) \cdot e^{-(y_k - \hat{y}_k^i)^2/2}.$$

State estimation is performed by $\hat{x}_k = \sum_{i=1}^{N} W_k^i x_k^i$, where $\hat{y}_k^i$ is an observation value of each particle at the time k, $\hat{x}_k$ is the state estimated value of the particles at the time k, $x_k^i$ is a state value of each particle at the time k, and N represents a maximum number of particles.

According to another aspect of the disclosure, the disclosure further provides a system of lithium battery SOC estimation based on second-order difference particle filtering. The system includes a second-order model building module, a model parameterization module, a density function generation module, and an SOC estimation module.

The second-order model building module is configured to build a second-order RC battery model of the lithium battery.

The model parameterization module is configured to perform model parameterization by using a least squares algorithm with a forgetting factor according to the second-order RC battery model of the lithium battery.

The density function generation module is configured to generate an importance density function through a second-order central difference Kalman filtering (SCDKF) algorithm.

The SOC estimation module is configured to improve a particle filtering algorithm according to the importance density function to obtain a second-order difference particle filtering (SCDPF) algorithm and perform SOC estimation on a lithium battery by using the SCDPF.

According to another aspect of the disclosure, the disclosure further provides a computer readable storage medium storing a computer program. The computer program performs any step of the method when being executed by a processor.

In general, the above technical solutions provided by the disclosure have the following beneficial effects compared with the related art.

(1) The importance density function is generated through the second-order central difference Kalman filtering (SCDKF) algorithm, and in this way, the particle degradation problem of the PF algorithm may be solved and filtering accuracy may be improved.

(2) SCDKF uses the Stirling interpolation formula to extend the nonlinear model in the form of central difference, so that the Jacobian matrix of the system function does not need to be calculated, and that the calculation complexity is low. Even if the system is discontinuous and non-linear, and there are singularities, the state may still be estimated. In the filtering process, the square root form of the covariance matrix is used to ensure the positive definiteness of the covariance matrix, so good numerical characteristics are provided, and filtering accuracy greater than that of the unscented filtering algorithm.

BRIEF DESCRIPTION OF THE DRAWINGS

FIG. 3A represents currents, and FIG. 3B represents voltages.

FIG. 5A represents the identification result of $R_{ac}$, FIG. 5B represents the identification result of $R_{ct}$, FIG. 5C represents the identification result of $R_{wb}$, FIG. 5D represents the identification result of $C_{ct}$, and FIG. 5E represents the identification result of $C_{wb}$.

FIG. 7A represents estimated values, and FIG. 7B represents estimated errors.

FIG. 8A represents the estimated values, and FIG. 8B represents the estimated errors.

DESCRIPTION OF THE EMBODIMENTS

To better illustrate the goal, technical solutions, and advantages of the disclosure, the following embodiments accompanied with drawings are provided so that the disclosure are further described in detail. It should be understood that the specific embodiments described herein serve to explain the disclosure merely and are not used to limit the disclosure. In addition, the technical features involved in the various embodiments of the disclosure described below can be combined with each other as long as the technical features do not conflict with each other.

Figure 1:
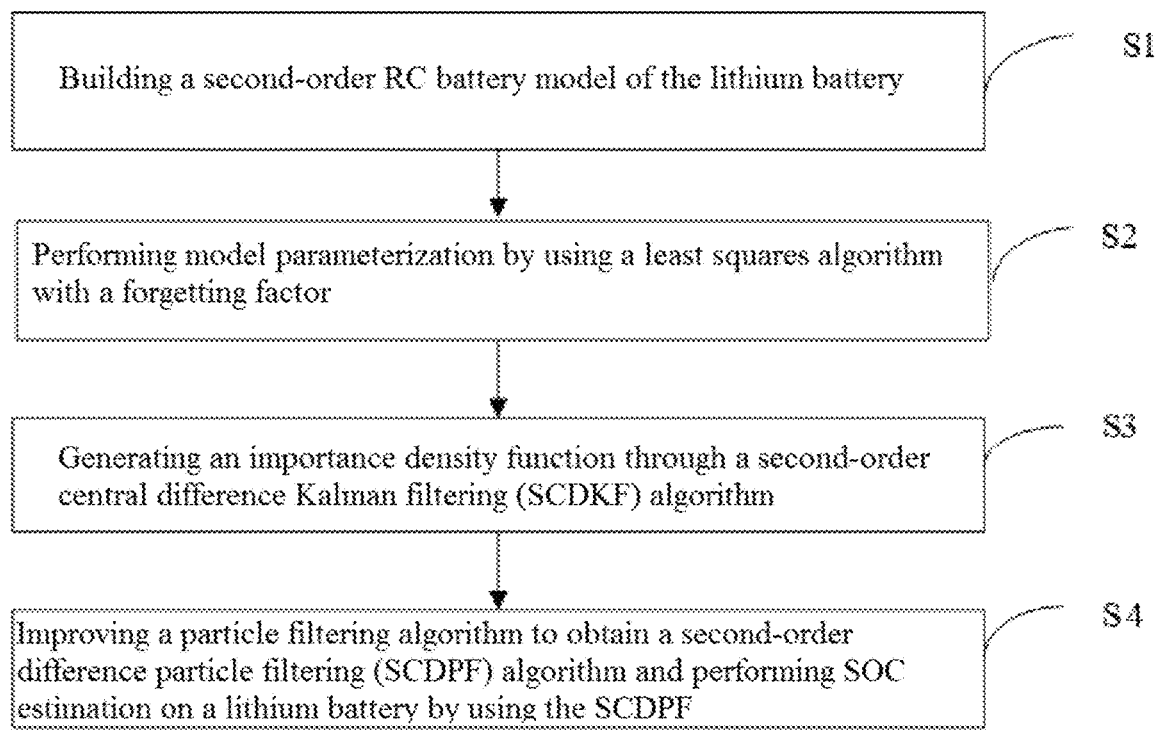
FIG. 1 is a schematic flow chart of a method of lithium battery state of charge (SOC) estimation based on second-order difference particle filtering provided by an embodiment of the disclosure.

FIG. 1 is a schematic flow chart of a method of lithium battery state of charge (SOC) estimation based on second-order difference particle filtering provided by an embodiment of the disclosure, and the followings steps are included.

In S1, a second-order RC battery model of the lithium battery is built.

Figure 2:
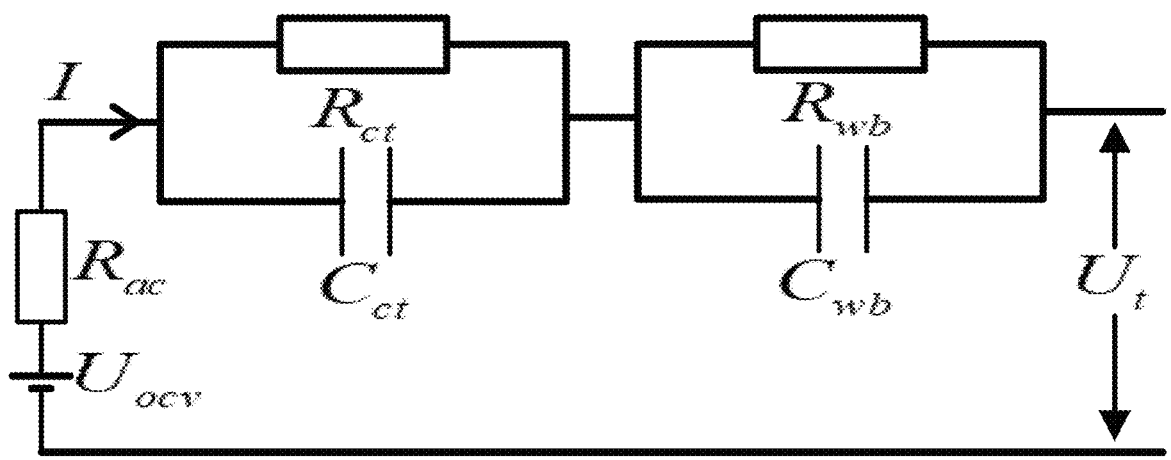
FIG. 2 is a circuit diagram of a battery second-order RC model provided by an embodiment of the disclosure.

FIG. 2 is a circuit diagram of a battery second-order RC model provided by an embodiment of the disclosure, and a state formula of the discretized battery second-order RC model is:

$$\begin{bmatrix} U_{ct}(k+1) \\ U_{wb}(k+1) \\ SOC(k+1) \end{bmatrix} = \begin{bmatrix} \exp\left(-\frac{T}{\tau_{ct}}\right) & 0 & 0 \\ 0 & \exp\left(-\frac{T}{\tau_{wb}}\right) & 0 \\ 0 & 0 & 1 \end{bmatrix} \begin{bmatrix} U_{ct}(k) \\ U_{wb}(k) \\ SOC(k) \end{bmatrix} + \begin{bmatrix} R_{ct}\cdot\left(1-\exp\left(-\frac{T}{\tau_{ct}}\right)\right) \\ R_{wb}\cdot\left(1-\exp\left(-\frac{T}{\tau_{wb}}\right)\right) \\ -\frac{T}{C} \end{bmatrix} I(k), \quad (1)$$

where T is a sampling interval, k is sampling time, $R_{ac}$ is ohmic resistance, $R_{ct}$ is charge transfer resistance, $R_{wb}$ is diffusion resistance, $C_{ct}$ is charge transfer capacitance, $C_{wb}$ is diffusion capacitance, $U_{ocv}$ is a circuit open circuit voltage, $U_{ct}$ is a voltage at both terminals of a $R_{ct}C_{ct}$ network, $U_{wb}$ is a voltage at both terminals of a $R_{wb}C_{wb}$ network, $U_t$ is a voltage at a model output terminal, I is a current at present, $\tau_{ct}$ is a time constant of the $R_{ct}C_{ct}$ network, $\tau_{wb}$ is a time constant of the $R_{wb}C_{wb}$ network, $\tau_{ct}=R_{ct}C_{ct}$, $\tau_{wb}=R_{wb}C_{wb}$, and C is battery capacitance.

A predicted terminal voltage of a battery after discretization is:

$$y(k+1) = \begin{bmatrix} -1 & -1 & \frac{\partial U_{ocv}}{\partial SOC} \end{bmatrix} \begin{bmatrix} U_{ct}(k) \\ U_{wb}(k) \\ SOC(k) \end{bmatrix} - R_{ac}I(k), \quad (2)$$

where y(k+1) is the predicted terminal voltage of the battery at time k+1.

Formula (1) may be written in the form of the following formula:

$$x_{k+1} = f(x) = A \cdot x_k + B \cdot I(k),$$

where $$A = \begin{bmatrix} \exp\left(-\dfrac{T}{\tau_{ct}}\right) & 0 & 0 \\ 0 & \exp\left(-\dfrac{T}{\tau_{wb}}\right) & 0 \\ 0 & 0 & 1 \end{bmatrix},$$

$$B = \begin{bmatrix} R_{ct} \cdot \left(1 - \exp\left(-\dfrac{T}{\tau_{ct}}\right)\right) \\ R_{wb} \cdot \left(1 - \exp\left(-\dfrac{T}{\tau_{wb}}\right)\right) \\ -\dfrac{T}{C} \end{bmatrix},$$

$$x_k = \begin{bmatrix} U_{ct}(k) \\ U_{wb}(k) \\ SOC(k) \end{bmatrix},$$

T is the sampling time interval, and k is the sampling time. $\tau_{ct}$ and $\tau_{wb}$ are time constants, $\tau_{ct}=R_{ct}C_{ct}$, and $\tau_{wb}=R_{wb}C_{wb}$.

A formula for predicting the terminal voltage of the battery model is written in the form of the following formula.

$$y(k+1)=h(x)=C \cdot x_k+D \cdot I(k),$$

where $$C = \begin{bmatrix} -1 & -1 & \dfrac{\partial U_{OCV}}{\partial SOC} \end{bmatrix},$$

$D=-R_{ac}$, and y(k) is the terminal voltage of the battery model.

Figure 3A:
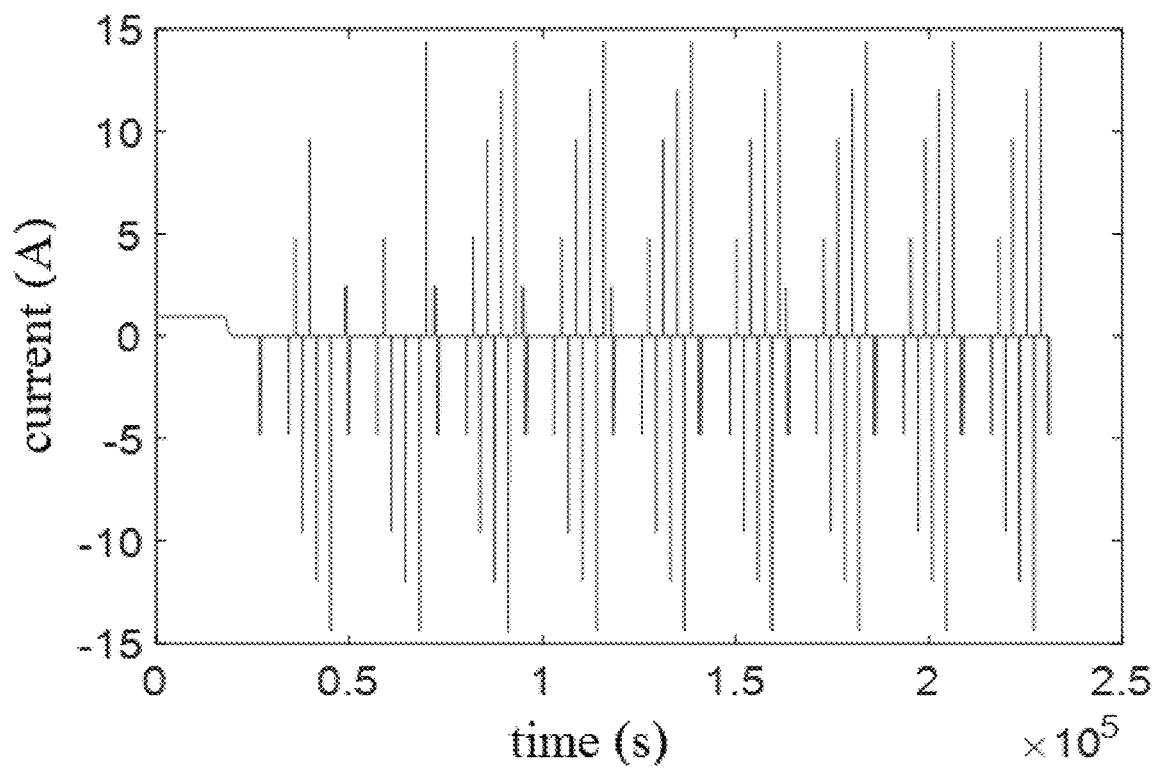
FIG. 3A and FIG. 3B are graphs of results of a hybrid pulse power characterization (HPPC) test of a battery provided by an embodiment of the disclosure.
Figure 3B:
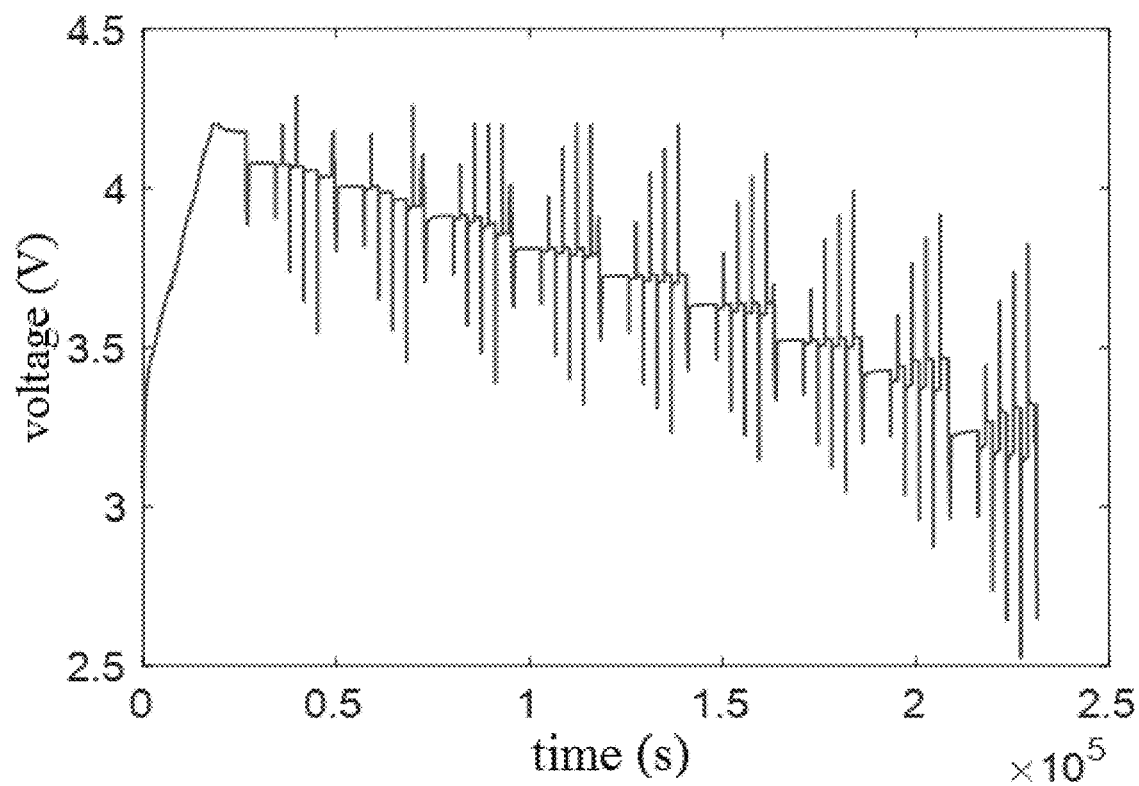
Figure 4:
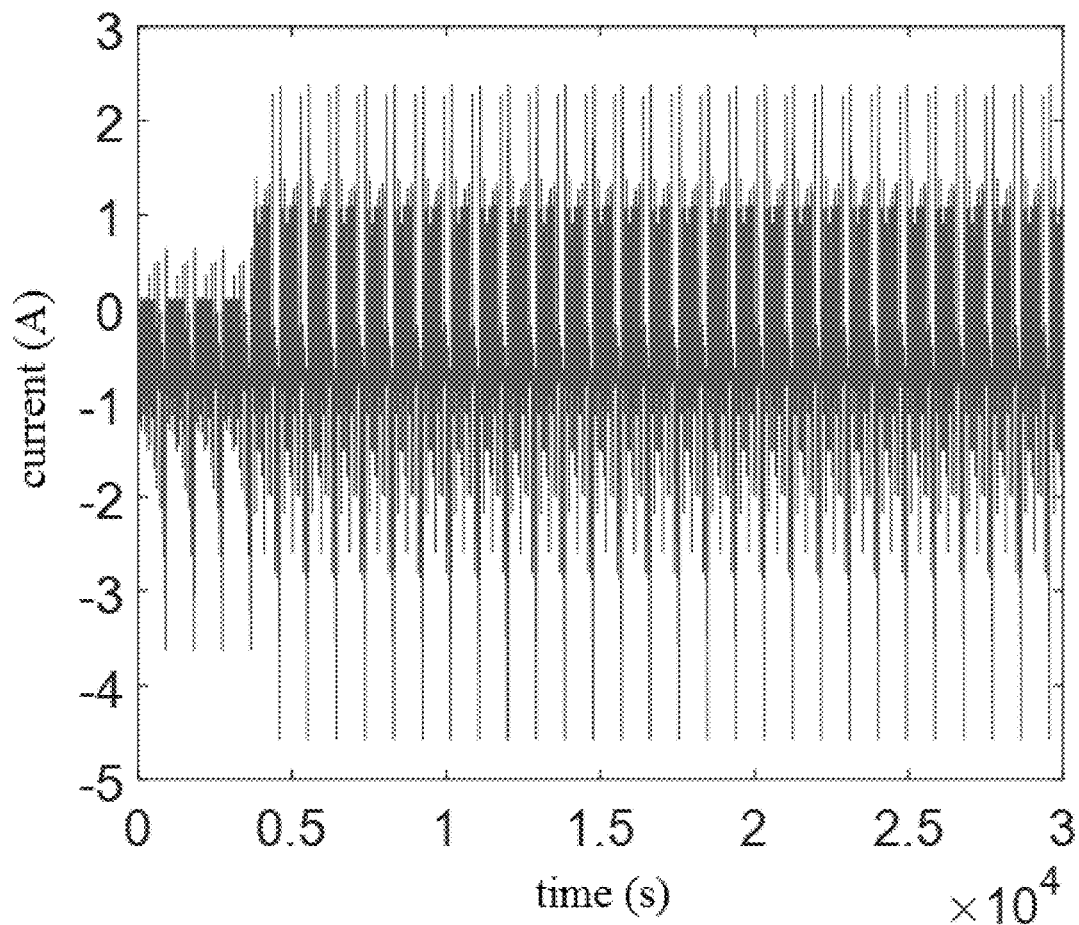
FIG. 4 is a graph of a battery NEDC operating condition current provided by an embodiment of the disclosure.

FIG. 3A and FIG. 3B are graphs of results of a hybrid pulse power characterization (HPPC) test of a battery provided by an embodiment of the disclosure, FIG. 3A represents currents, and FIG. 3B represents voltages. FIG. 4 is a graph of a battery NEDC operating condition current provided by an embodiment of the disclosure. A ternary 21,700 battery from a specific company is used for model parameterization and SOC estimation, a rated capacity is 4.8 Ah, and a rated voltage is 3.6V. The experimental platform is mainly formed by a lithium ion battery charging and discharging test system (Arbin BT2000), an ultra-low temperature experiment cabinet and constant temperature experiment box (HLT402P), 2 upper computers, and ternary lithium ion batteries. Through the experiment on the test platform, data of the HPPC operating condition and NEDC operating condition is shown in FIG. 3A, FIG. 3B, and FIG. 4.

In S2, Model parameterization is performed by using a least squares algorithm with a forgetting factor.

To obtain parameters of the battery model, first, the terminal voltage of the battery is written in a least squares form:

$$y(k)=\varphi(k)\theta^T+e(k) \qquad (3),$$

where $\varphi(k)=[y(k-1)y(k-2)I(k)I(k-1)I(k-2)]$, e(k) is a sampling error of a sensor at time k, and a parameter matrix of the battery model is identified as $\theta=[\theta_1 \theta_2 \theta_3 \theta_4 \theta_5]$, where the variables of θ are coefficients corresponding to $$y(k)=U_{OCV}(k)-U_t=\theta_1 y(k-1)+\theta_2 y(k-2)+\theta_3 I(k)+\theta_4 I(k-1)+\theta_5 I(k-2).$$

The parameter identification is performed on the parameter θ by using the least squares algorithm with a forgetting factor, and the formula is provided as follows:

$$\hat{\theta}(k) = \hat{\theta}(k-1) + K(k)[y(k) - \varphi^T(k)\hat{\theta}(k-1)] \qquad (4)$$

$$K(k) = P(k-1)\varphi(k)[\lambda + \varphi^T(k)P(k-1)\varphi(k)]^{-1}$$

$$P(k) = \dfrac{1}{\lambda}[I - K(k)\varphi^T(k)]P(k-1),$$

where λ is the forgetting factor, and $\hat{\theta}$ is the estimated value of θ.

The model parameters $R_{ac}$, $R_{ct}$, $R_{wb}$, $\tau_{ct}$, and $\tau_{wb}$ may be obtained through the following formula:

$$\begin{cases} R_{ac} = \dfrac{\theta_3 - \theta_4 + \theta_5}{1 + \theta_1 - \theta_2} \\ \tau_{ct}\tau_{wb} = \dfrac{T^2(1+\theta_1-\theta_2)}{4(1-\theta_1-\theta_2)} \\ \tau_{ct} + \tau_{wb} = \dfrac{T(1+\theta_2)}{1-\theta_1-\theta_2} \\ R_{ac} + R_{ct} + R_{wb} = \dfrac{\theta_3+\theta_4+\theta_5}{1-\theta_1-\theta_2} \\ R_{ac}\tau_{wb} + R_{ac}\tau_{ct} + R_{ct}\tau_{wb} + R_{wb}\tau_{ct} = \dfrac{T(\theta_3-\theta_5)}{1-\theta_1-\theta_2} \end{cases} \qquad (5)$$

Figure 5A:
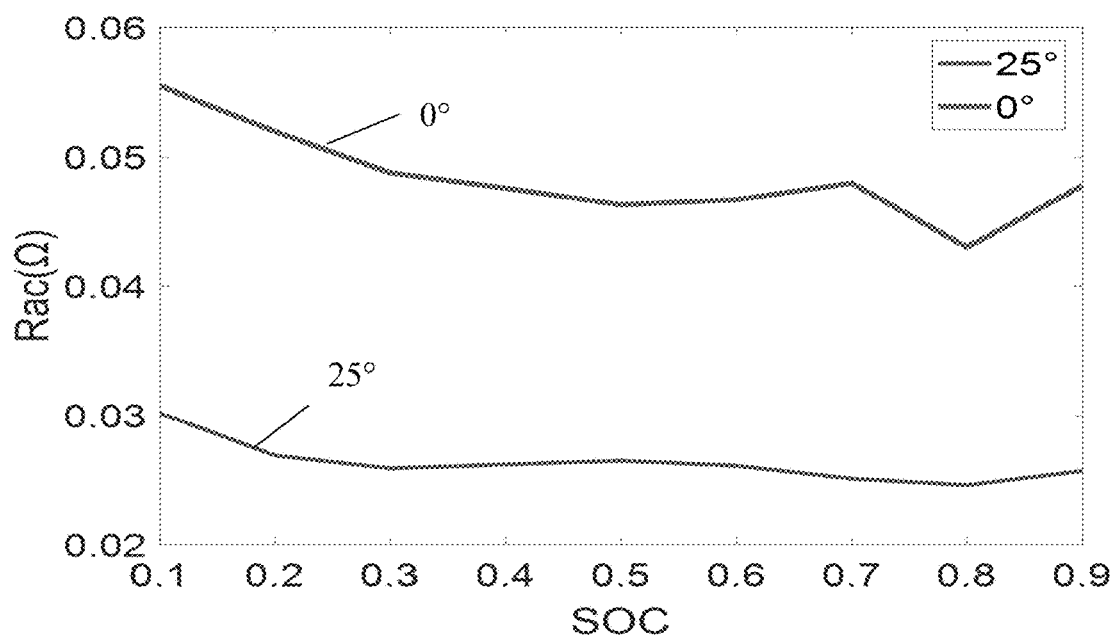
FIG. 5A, FIG. 5B, FIG. 5C, FIG. 5D, and FIG. 5E are identification results of battery model parameters provided by an embodiment of the disclosure, which are obtained by adopting a least squares algorithm with a forgetting factor, where
Figure 5B:
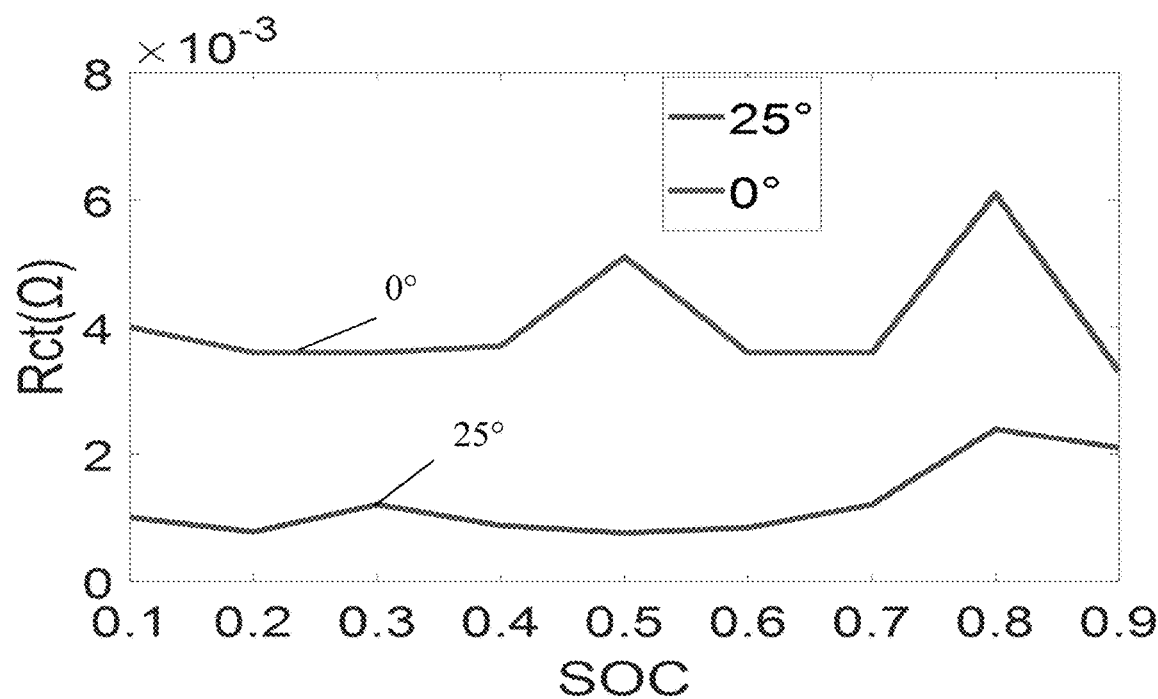
Figure 5C:
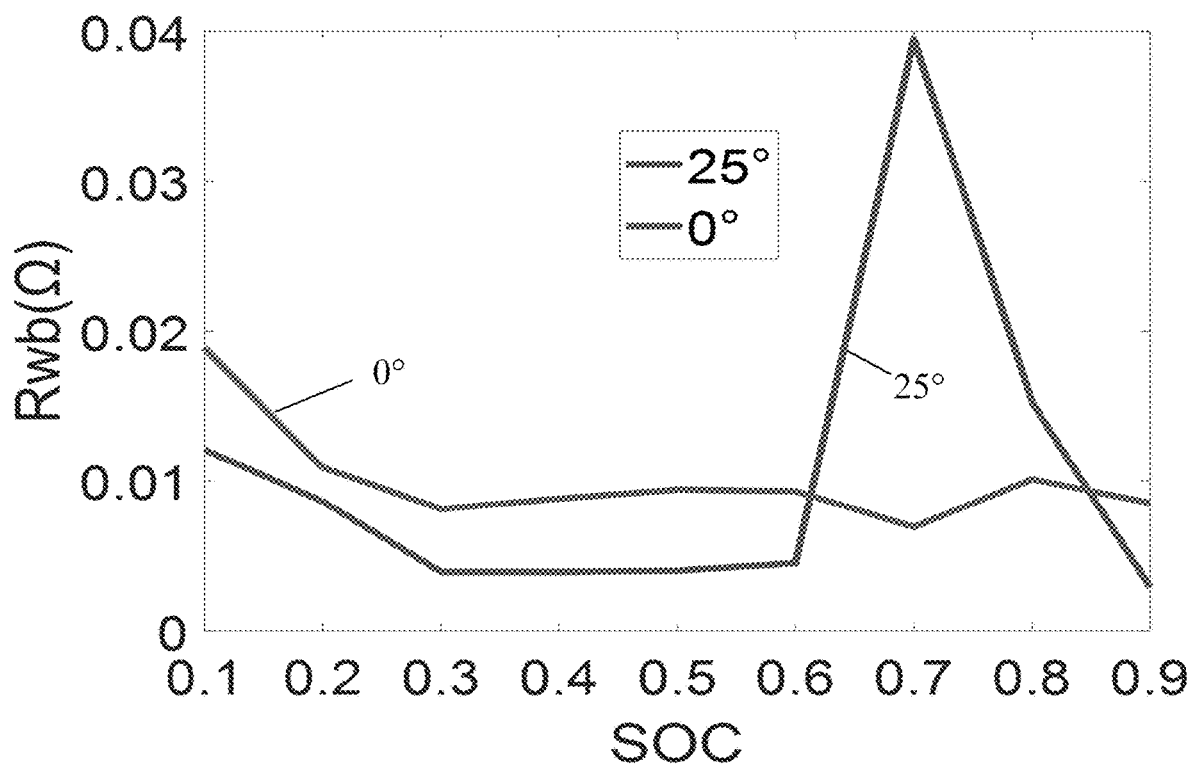
Figure 5D:
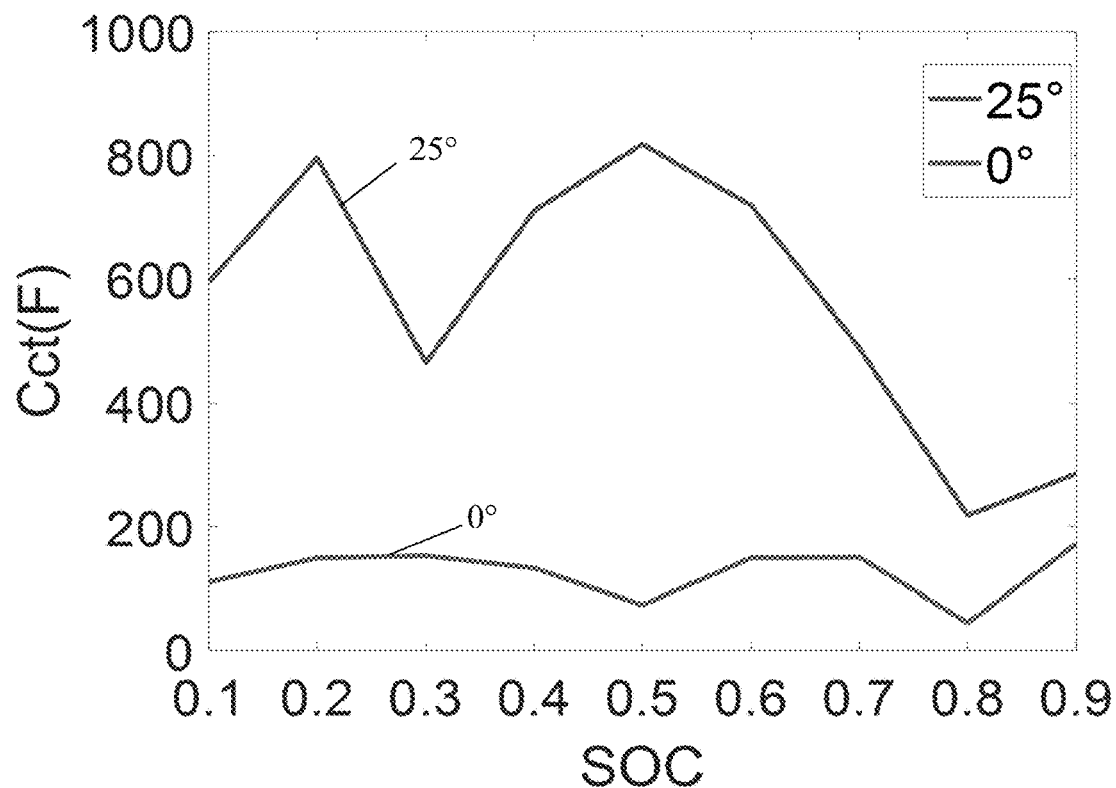
Figure 5E:
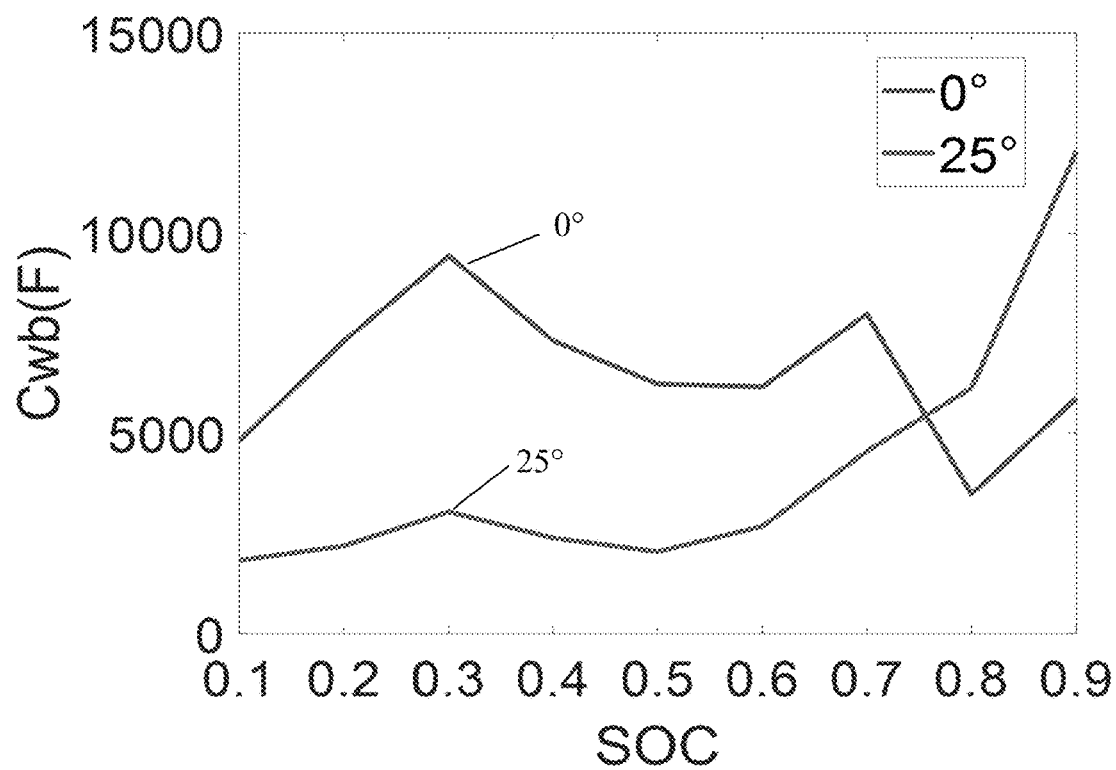

An MATLAB program is written, the data of the HPPC operating condition obtained through experimental testing is substituted into formula (4) and formula (5), and the parameter identification is performed on a second-order RC equivalent circuit model to obtain the model parameters shown in FIG. 5A, FIG. 5B, FIG. 5C, FIG. 5D, and FIG. 5E, where FIG. 5A represents the identification result of $R_{ac}$, FIG. 5B represents the identification result of $R_{ct}$, FIG. 5C represents the identification result of $R_{wb}$, FIG. 5D represents the identification result of $C_{ct}$, and FIG. 5E represents the identification result of $C_{wb}$.

In S3, an importance density function is generated through a second-order central difference Kalman filtering (SCDKF) algorithm.

Specific implementation of step S3 is provided as follows.

In S3.1, a first-order difference matrix and a second-order difference matrix are generated: four square root decomposition operators are obtained through Cholesky decomposition:

$$Q=S_v \times S_v^T, R=S_w \times S_w^T, \overline{P}=\overline{S}_x \times \overline{S}_x^T, \hat{P}=\hat{S}_x^T \qquad (6),$$

where Q is a system process noise covariance matrix, R is a system observation noise covariance matrix, $\overline{P}$ is a system prediction covariance, $\hat{P}$ is a system estimation covariance, $\overline{P}$ and $\hat{P}$ are constantly updated during the filtering process, $S_v$ represents a process noise covariance square root decomposition operator, $S_w$ represents an observed noise covariance square root decomposition operator, $\overline{S}_x$ represents a system prediction covariance square root decomposition operator, and $\hat{S}_x$ represents a system estimation covariance square root decomposition operator.

The first-order difference matrix and the second-order difference matrix of each particle (i.e., each state variable x) are obtained through the square root decomposition operators:

$$(S_{x\bar{x}}^{(1)}(k))^{(i)} = \{(f_i(\hat{x}_{k-1} + \lambda \hat{s}_{x,j}, \bar{v}_{k-1}) - f_i(\hat{x}_{k-1} - \lambda \hat{s}_{x,j}, \bar{v}_{k-1}))/2\lambda\}; \quad (7)$$
$$j = 1:n_x$$
$$(S_{xv}^{(1)}(k))^{(i)} = \{(f_i(\hat{x}_{k-1}, \bar{v}_{k-1} + \lambda s_{v,j}) - f_i(\hat{x}_{k-1}, \bar{v}_{k-1} - \lambda s_{v,j}))/2\lambda\};$$
$$j = 1:n_v$$
$$(S_{y\bar{x}}^{(1)}(k))^{(i)} = \{(h_i(\bar{x}_k + \lambda \bar{s}_{x,j}, \bar{w}_k) - h_i(\bar{x}_k - \lambda \bar{s}_{x,j}, \bar{w}_k))/2\lambda\};$$
$$j = 1:n_x$$
$$(S_{yw}^{(1)}(k))^{(i)} = \{(h_i(\bar{x}_k, \bar{w}_k + \lambda s_{w,j}) - h_i(\bar{x}_k, \bar{w}_k - \lambda s_{w,j}))/2\lambda\};$$
$$j = 1:n_v,$$

and $$(S_{x\bar{x}}^{(2)}(k))^{(i)} = \left\{ \frac{(\lambda^2 - 1)^{1/2}}{2\lambda^2} (f_i(\hat{x}_{k-1} + \lambda \hat{s}_{x,j}, \bar{v}_{k-1}) + \right. \quad (8)$$
$$\left. f_i(\hat{x}_{k-1} - \lambda \hat{s}_{x,j}, \bar{v}_{k-1}) - 2f_i(\hat{x}_{k-1}, \bar{v}_{k-1})) \right\};$$
$$j = 1:n_x$$
$$(S_{xv}^{(2)}(k))^{(i)} = \left\{ \frac{(\lambda^2 - 1)^{1/2}}{2\lambda^2} (f_i(\hat{x}_{k-1}, \bar{v}_{k-1} + \lambda s_{v,j}) + \right.$$
$$\left. f_i(\hat{x}_{k-1}, \bar{v}_{k-1} - \lambda s_{v,j}) - 2f_i(\hat{x}_{k-1}, \bar{v}_{k-1})) \right\};$$
$$j = 1:n_x$$
$$(S_{y\bar{x}}^{(2)}(k))^{(i)} = \left\{ \frac{(\lambda^2 - 1)^{1/2}}{2\lambda^2} \right.$$
$$(h_i(\bar{x}_k + \lambda \bar{s}_{x,j}, \bar{w}_k) + h_i(\bar{x}_k - \lambda \bar{s}_{x,j}, \bar{w}_k) - 2h_i(\bar{x}_k, \bar{w}_k)) \right\};$$
$$j = 1:n_x$$
$$(S_{yw}^{(2)}(k))^{(i)} = \left\{ \frac{(\lambda^2 - 1)^{1/2}}{2\lambda^2} (h_i(\bar{x}_k, \bar{w}_k + \lambda s_{w,j}) + \right.$$
$$\left. h_i(\bar{x}_k, \bar{w}_k - \lambda s_{w,j}) - 2h_i(\bar{x}_k, \bar{w}_k)) \right\}; j = 1:n_v,$$

where $\hat{s}_{x,j}$, $\bar{s}_{x,j}$, $s_{v,j}$, and $s_{w,j}$ respectively are a $j^{th}$ column of $\hat{S}_x$, $\bar{S}_x$, $S_v$, and $S_w$, $\hat{x}_{k-1}$ and $\bar{x}_{k-1}$ respectively are an estimated value and a predicted value of a state variable $x_k$ of the system at the time k-1, $n_x$ is a dimension of a state vector of the system, $n_v$ is a dimension of an observation noise vector of the system, $S_{x\bar{x}}^{(1)}(k)$ is a first-order difference matrix of a system estimation covariance, $S_{xv}^{(1)}(k)$ is a first-order difference matrix of a process noise covariance, $S_{y\bar{x}}^{(1)}(k)$ is a first-order difference matrix of a system prediction covariance, $S_{yw}^{(1)}(k)$ is a first-order difference matrix of an observation noise covariance, $f_i$, $h_i$, and $\lambda$ are given variable step lengths, and an optimal choice is $\lambda^2=3$, $\bar{v}_{k-1}$ is system observation noise, $\bar{x}_k$ is the predicted value of the system at the time $_k$, $\bar{w}_k$ is system process noise, i is the number of particles, $S_{x\bar{x}}^{(2)}(k)$ is a second-order difference matrix of the system estimation covariance, $S_{xv}^{(2)}(k)$ is a second-order difference matrix of the process noise covariance, $S_{y\bar{x}}^{(2)}(k)$ is a second-order difference matrix of the system prediction covariance, and $S_{yw}^{(2)}(k)$ represents a second-order difference matrix of the observation noise covariance.

In S3.2, state prediction is performed.

The one-step predicted value of the particles is:

$$\bar{x}_k^{(i)} = \frac{\lambda^2 - n_x - n_v}{\lambda^2} f_i(\hat{x}_{k-1}, \bar{v}_{k-1}) + \quad (9)$$
$$\frac{1}{2\lambda^2} \sum_{p=1}^{n_x} [f_i(\hat{x}_{k-1} + \lambda \hat{s}_{x,p}, \bar{v}_{k-1}) + f_i(\hat{x}_{k-1} - \lambda \hat{s}_{x,p}, \bar{v}_{k-1})] +$$

-continued
$$\frac{1}{2\lambda^2} \sum_{p=1}^{n_v} [f_i(\hat{x}_{k-1}, \bar{v}_{k-1} + \lambda s_{v,p}) + f_i(\hat{x}_{k-1}, \bar{v}_{k-1} - \lambda s_{v,p}),$$

where $\hat{s}_{x,p}$ represents a $p^{th}$ column of $\hat{S}_x$, and $s_{v,p}$ represents the $p^{th}$ column of $S_v$.

The composite matrix $\bar{S}_x^{(i)}(k)$ of the predicted state error mean square matrix is:

$$\bar{S}_x^{(i)}(k) = [(S_{x\bar{x}}^{(1)}(k))^{(i)}(S_{xv}^{(1)}(k))^{(i)}$$
$$(S_{x\bar{x}}^{(1)}(k))^{(i)}(S_{yw}^{(1)}(k))^{(i)}] \quad (10).$$

A rectangular matrix $\bar{S}_x^{(i)}(k)$ which is obtained by using QR to decompose formula (10) is converted into a Cholesky factor-square matrix $\bar{S}_x^{(i)}(k)$ of the predicted state error mean square matrix:

$$\begin{cases} [Q, R] = qr\left(\bar{S}_x^{(i)}(k)^T\right) \\ \bar{S}_x^{(i)}(k) = R \end{cases} \quad (11)$$

A predicted error covariance matrix is updated through the following formula:

$$\bar{P}_k^{(i)} = \bar{S}_x^{(i)}(k) \bar{S}_x^{(i)}(k)^T \quad (12).$$

A composite matrix $\bar{S}_y^{(i)}(k)$ of a predicted mean square error matrix is:

$$\bar{S}_y^{(i)}(k) = [(S_{y\bar{x}}^{(1)}(k))^{(i)}(S_{yw}^{(1)}(k))^{(i)}$$
$$(S_{y\bar{x}}^{(2)}(k))^{(i)}(S_{yw}^{(2)}(k))^{(i)}] \quad (13)$$

Similar to the acquisition of the predicted state error mean square matrix, the QR decomposition of the composite matrix is performed by using formula (13), and the Cholesky factor-square matrix $\bar{S}_y^{(i)}(k)$ of the predicted mean square error matrix is obtained:

$$\begin{cases} [Q, R] = qr\left(\bar{S}_y^{(i)}(k)^T\right) \\ \bar{S}_y^{(i)}(k) = R \end{cases} \quad (14)$$

A predicted output voltage value is:

$$\bar{y}_k^{(i)} = \frac{\lambda^2 - n_x - n_v}{\lambda^2} kh(\bar{x}_k, \bar{w}_k) + \quad (15)$$
$$\frac{1}{2\lambda^2} \sum_{p=1}^{n_x} [h(\bar{x}_k - \lambda \bar{s}_{x,p}, \bar{w}_k) + h(\bar{x}_k + \lambda \bar{s}_{x,p}, \bar{w}_k)] +$$
$$\frac{1}{2\lambda^2} \sum_{p=1}^{n_w} [h(\bar{x}_k, \bar{w}_k + \lambda s_{w,p}) + h(\bar{x}_k, \bar{w}_k - \lambda s_{w,p})],$$

where $n_w$ is a dimension of a process noise vector of the system, k is the sampling time, $h(\bar{x}_k, \bar{w}_k)$ is an observation formula, $\bar{s}_{x,p}$ is the $p^{th}$ column of $\bar{S}_x$, and $s_{w,p}$ represents the $p^{th}$ column of $S_w$.

A mutual prediction error mean square matrix $P_{xy}^{(i)}(k)$ of the system is:

$$P_{xy}^{(i)}(k) = \bar{S}_x^{(i)}(k)[(S_{y\bar{x}}^{(1)}(k))^{(i)}]^T \quad (16).$$

The Kalman gain $K_k$ is:

$$K_k^{(i)} = P_{xy}^{(i)}(k)[S_y^{(i)}(k) S_y^{(i)}(k)^T]^{-1} \quad (17).$$

State estimated value $\hat{x}_k^{(i)}$ of the particles is updated as:

$$\hat{x}_k^{(i)} = \bar{x}_k^{(i)} + K_k^{(i)}(y_k - \bar{y}_k^{(i)}) \quad (18),$$

where $y_k$ is the actual terminal voltage value.

Similar to the manner of calculating the square matrices $\bar{S}_x^{(i)}(k)$ and $\bar{S}_y^{(i)}(k)$, the same manner may be used to calculate and obtain a Cholesky factor $\hat{S}_x^{(i)}(k)$ of an estimated error covariance matrix:

$$\hat{S}_x^{(i)}(k) = [\bar{S}_x^{(i)}(k) - K_k^{(i)}(S_{y\bar{x}}^{(1)}(k))^{(i)} K_k^{(i)}(S_{y\nu}^{(1)}(k))^{(i)} K_k^{(i)}$$
$$(S_{y\nu}^{(2)}(k))^{(i)} K_k^{(i)}(S_{y\nu}^{(2)}(k))^{(i)}]$$

$$[Q,R] = gr(\hat{S}_x^{(1)}(k)^T); \hat{S}_x^{(i)}(k) = R \quad (19).$$

A covariance estimation $\hat{P}_k^{(i)}$ is updated as:

$$\hat{P}_k^{(i)} = \hat{S}_x^{(i)}(k)\hat{S}_x^{(i)}(k)^T \quad (20).$$

In S4, a particle filtering algorithm is improved to obtain a second-order difference particle filtering (SCDPF) algorithm, and SOC estimation is performed on a lithium battery by using the SCDPF.

Figure 6:
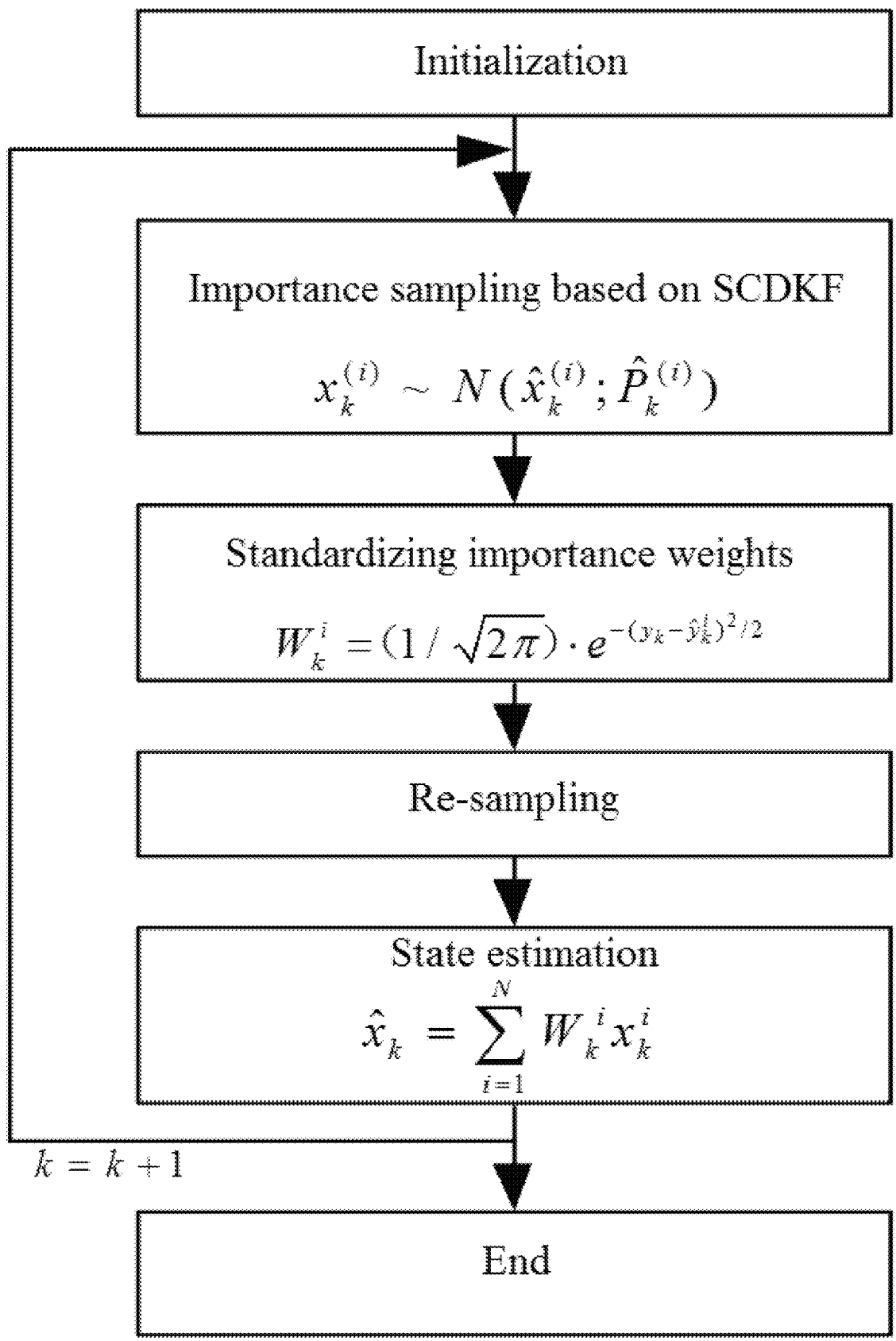
FIG. 6 is a schematic flow chart of a second-order difference particle filtering (SCDPF) algorithm provided by an embodiment of the disclosure.

As shown in FIG. 6, the SCDKF algorithm is used for importance sampling and is substituted into the particle filter algorithm to obtain a second-order central difference particle filtering (SCDPF) algorithm. Through the importance sampling, standardization of importance weights, re-sampling, and state estimation, the SOC value of the battery is ultimately obtained.

In step S4, importance sampling is performed on the particles by using $\hat{x}_k^{(i)}$ and $\hat{P}_k^{(i)}$ obtained in step S3 to obtain the second-order difference particle filtering (SCDPF) algorithm. Importance sampling is performed through formula (21):

$$x_k^{(i)} \sim N(\hat{x}_k^{(i)}; \hat{P}_k^{(i)}) \quad (21).$$

The importance weights are then standardized through formula (22):

$$W_k^i = (1/\sqrt{2\pi}) \cdot e^{-(y_k - y_k^i)^2/2} \quad (22).$$

State estimation is performed through formula (23):

$$\hat{x}_k = \Sigma_{i=1}^N W_k^i x_k^i \quad (23),$$

where $\hat{y}_k^i$ is an observation value of each particle at the time k, $\hat{x}_k$ is the state estimated value of the particles at the time k, $x_k^i$ is a state value of each particle at the time k, and N represents a maximum number of particles.

The final SOC value of the battery is:

$$x_k = \begin{bmatrix} U_{ct}(k) \\ U_{wb}(k) \\ SOC(k) \end{bmatrix},$$

and if $x_k$ is obtained, the SOC is obtained.

Figure 7A:
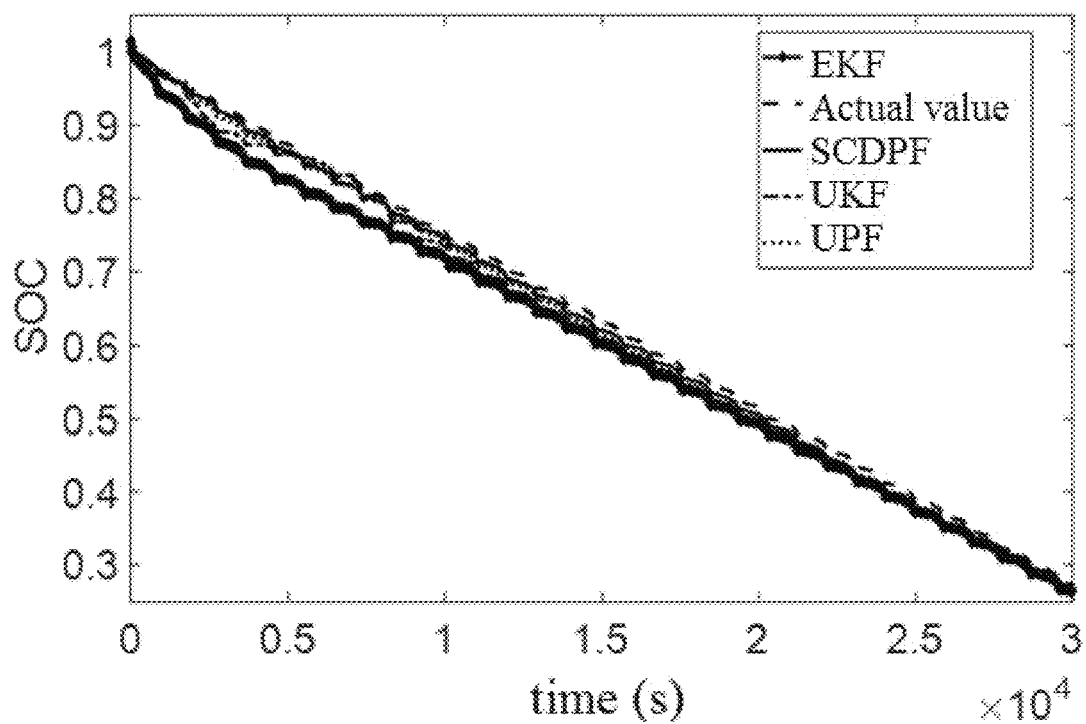
FIG. 7A and FIG. 7B are graphs of comparisons of an SOC estimation algorithm at 25° provided by an embodiment of the disclosure.
Figure 7B:
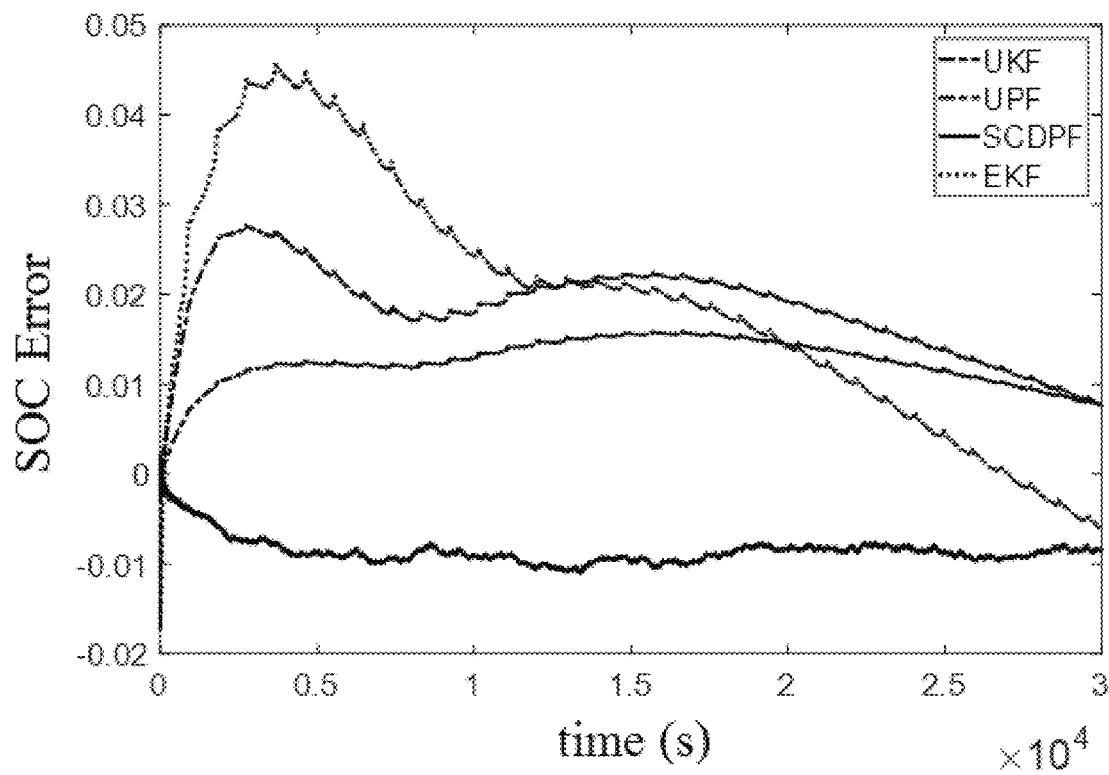
Figure 8A:
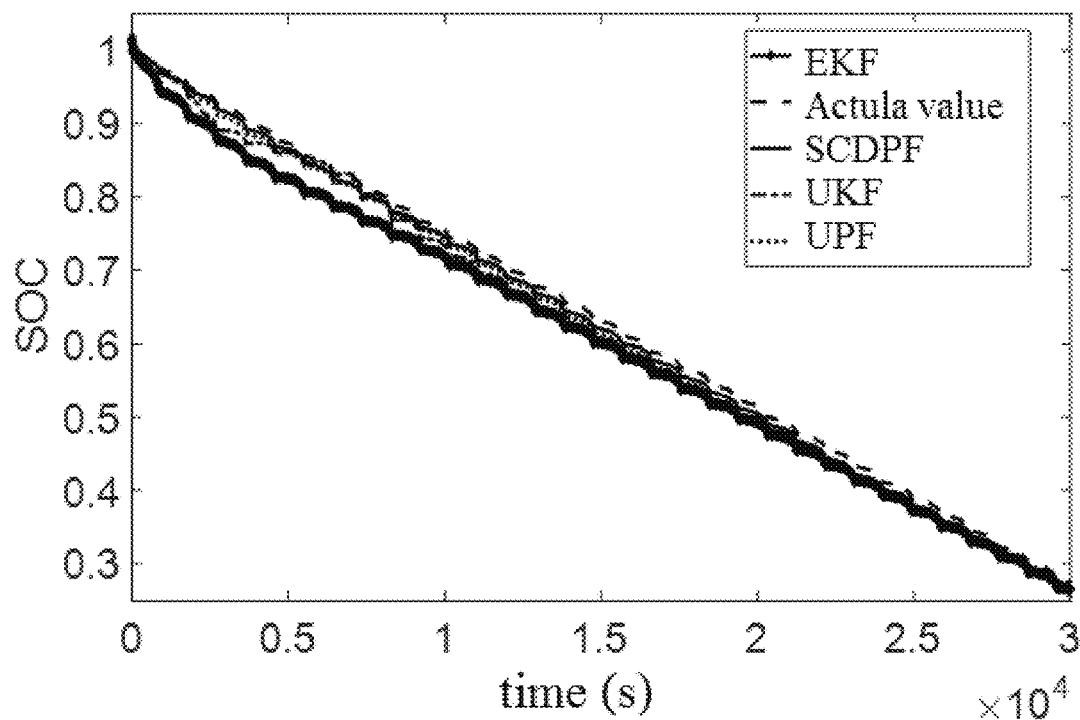
FIG. 8A and FIG. 8B are graphs of comparisons of the SOC estimation algorithm at 0° provided by an embodiment of the disclosure.
Figure 8B:
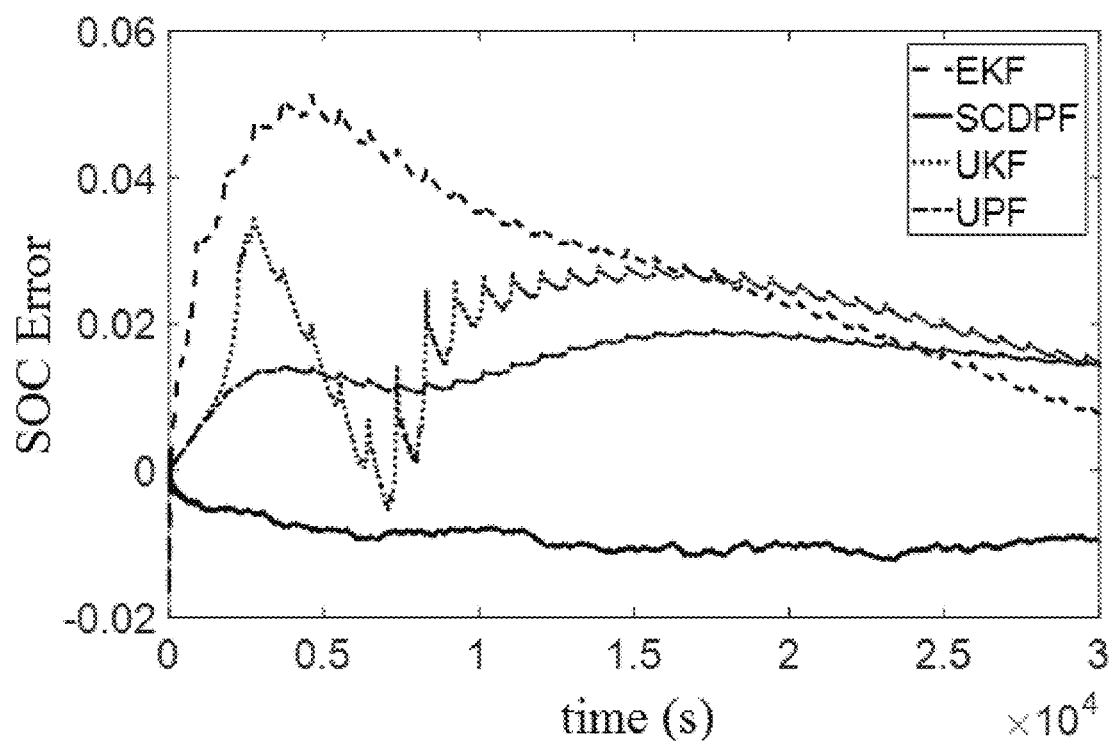

The data of the NEDC operating condition is substituted into the SCDPF algorithm for SOC estimation, and comparison graphs of an SOC estimation algorithm at 25° and 0° are obtained. With reference to FIG. 7 and FIG. 8, where FIG. 7A and FIG. 7B are graphs of comparisons of the SOC estimation algorithm at 25°, FIG. 7A represents estimated values, and FIG. 7B represents estimated errors. FIG. 8A and FIG. 8B are graphs of comparisons of the SOC estimation algorithm at 0°, FIG. 8A represents the estimated values, and FIG. 8B represents the estimated errors. From FIG. 7A and FIG. 7B, it can be seen that when an ambient temperature is 25°, an extended Kalman filtering (EKF) algorithm, an unscented Kalman filtering (UKF) algorithm, an unscented particle filtering (UPF) algorithm, and the proposed SCDPF algorithm may all perform SOC estimation well, and the estimation errors are all small. Among them, the SOC estimated value obtained by the EKF algorithm has the largest error, and the proposed SCDPF algorithm has the smallest estimation error, and is greatly improved. It can be seen from FIG. 8A and FIG. 8B that there are similar conclusions at 0° and at 25°. The SOC estimated value obtained by using the EKF algorithm, UKF algorithm, UPF algorithm, and the proposed SCDPF algorithm may follow the actual value changes well. The SOC error of the proposed SCDPF algorithm is smaller, and estimation accuracy is greatly improved.

With reference to Table 1 and Table 2, Table 1 is the error comparison of the SOC estimation algorithm at 25°. Table 2 is the error comparison of the SOC estimation algorithm at 0°. It can be seen from Table 1 that the SOC estimation error obtained by the EKF algorithm is the largest at 25°, and the maximum error, MAE, RMSE, and MAPE respectively are 0.0458, 0.0202, 0.0237, and 3.478%. The four SOC errors obtained by the UKF algorithm correspond to 0.0277, 0.0162, 0.0176, and 2.779%. The SOC errors obtained by the UPF algorithm correspond to 0.0160, 0.0109, 0.0117, and 1.80%. The SOC errors calculated and obtained by the proposed SCDPF algorithm correspond to 0.0109, 0.0083, 0.0084, and 1.25%. The estimation accuracy of the proposed SCDPF algorithm is significantly improved. It can be seen from Table 2 that the SOC estimation error at 0° is similar to that at 25°. The SOC error obtained by the EKF algorithm is the largest, the accuracy of the UKF algorithm is higher than that of the EKF algorithm, the accuracy of the UPF algorithm is greater than that of the UKF algorithm, and the SOC error obtained by the proposed SCDPF algorithm is the smallest, so the accuracy is significantly improved. However, the SOC estimation error values of all algorithms at 0° are slightly greater than the corresponding SOC error values at 25°.

TABLE 1

| Algorithm | Maximum error | MAE | RMSE | MAPE |
|---|---|---|---|---|
| EKF | 0.0458 | 0.0202 | 0.0237 | 3.478% |
| UKF | 0.0277 | 0.0162 | 0.0176 | 2.779% |
| UPF | 0.0160 | 0.0109 | 0.0117 | 1.80% |
| SCDPF | 0.0109 | 0.0083 | 0.0084 | 1.25% |

TABLE 2

| Algorithm | Maximum error | MAE | RMSE | MAPE |
|---|---|---|---|---|
| EKF | 0.0514 | 0.0281 | 0.0306 | 4.476% |
| UKF | 0.0348 | 0.0197 | 0.0211 | 2.714% |
| UPF | 0.0193 | 0.0148 | 0.0152 | 2.000% |
| SCDPF | 0.0123 | 0.0092 | 0.0094 | 1.242% |

The method of lithium battery SOC estimation based on second-order difference particle filtering provided by the disclosure not only provides battery SOC estimation but also achieves improved accuracy compared to the EKF algorithm, the UKF algorithm, and the UPF algorithm.

The disclosure further provides a system of lithium battery state of charge (SOC) estimation based on second-order difference particle filtering, the system including:

a second-order model building module, configured to build a second-order RC battery model of the lithium battery;

a model parameterization module, configured to perform model parameterization by using a least squares algorithm with a forgetting factor according to the second-order RC battery model of the lithium battery;

a density function generation module, configured to generate an importance density function through a second-order central difference Kalman filtering (SCDKF) algorithm; and an SOC estimation module, configured to improve a particle filtering algorithm according to the importance density function to obtain a second-order difference particle filtering (SCDPF) algorithm and perform SOC estimation on a lithium battery by using the SCDPF.

Herein, specific implementation of each of the modules may be found with reference to the description of the method embodiments, and description thereof is not repeated in the embodiments of the disclosure.

The disclosure further provides a computer-readable storage medium provided with a computer program, and the computer program executes the method of lithium battery SOC estimation based on second-order difference particle filtering in the method claims when being executed by a processor.

Note that according to implementation requirements, each step/part described in the disclosure may be further divided into more steps/parts, or two or more steps/parts or partial operations of a step/part may be combined into a new step/part to accomplish the goal of the disclosure.

A person having ordinary skill in the art should be able to easily understand that the above description is only preferred embodiments of the disclosure and is not intended to limit the disclosure. Any modifications, equivalent replacements, and modifications made without departing from the spirit and principles of the disclosure should fall within the protection scope of the disclosure.

What is claimed is:

1. A method of lithium battery state of charge (SOC) estimation based on second-order difference particle filtering, comprising:
   (1) building a second-order RC battery model of a lithium battery;
   (2) performing model parameterization by using a least squares algorithm with a forgetting factor;
   (3) generating an importance density function through a second-order central difference Kalman filtering (SCDKF) algorithm; and
   (4) improving a particle filtering algorithm according to the importance density function to obtain a second-order difference particle filtering (SCDPF) algorithm, performing SOC estimation on the lithium battery by using the SCDPF,
   wherein in step (1),
   a state formula of the discretized battery second-order RC model is:

$$x_{k+1} = A \cdot x_k + B \cdot I(k),$$

$$A = \begin{bmatrix} \exp\left(-\dfrac{T}{\tau_{ct}}\right) & 0 & 0 \\ 0 & \exp\left(-\dfrac{T}{\tau_{wb}}\right) & 0 \\ 0 & 0 & 1 \end{bmatrix},$$

$$B = \begin{bmatrix} R_{ct} \cdot \left(1 - \exp\left(-\dfrac{T}{\tau_{ct}}\right)\right) \\ R_{wb} \cdot \left(1 - \exp\left(-\dfrac{T}{\tau_{wb}}\right)\right) \\ -\dfrac{T}{C} \end{bmatrix},$$

$$x_k = \begin{bmatrix} U_{ct}(k) \\ U_{wb}(k) \\ SOC(k) \end{bmatrix},$$

$$x_{k+1} = \begin{bmatrix} U_{ct}(k+1) \\ U_{wb}(k+1) \\ SOC(k+1) \end{bmatrix},$$

wherein T is a sampling time interval, k is sampling time, $R_{ac}$ is ohmic resistance, $R_{ct}$ is charge transfer resistance, $R_{wb}$ is diffusion resistance, $C_{ct}$ is charge transfer capacitance, $C_{wb}$ is diffusion capacitance, $U_{ocv}$ is a circuit open circuit voltage, $U_{ct}$ is a voltage at both terminals of a $R_{ct}C_{ct}$ network, $U_{wb}$ is a voltage at both terminals of a $R_{wb}C_{wb}$ network, $U_t$ is a voltage at a model output terminal, I is a current at present, $\tau_{ct}$ is a time constant of the $R_{ct}C_{ct}$ network, $\tau_{wb}$ is a time constant of the $R_{wb}C_{wb}$ network, $\tau_{ct}=R_{ct}C_{ct}$, $\tau_{wb}=R_{wb}C_{wb}$, and C is battery capacitance, a predicted terminal voltage of a battery after discretization is:

$$y(k+1) = C \cdot x_k + D \cdot I(k),$$

$$C = \begin{bmatrix} -1 & -1 & \dfrac{\partial U_{ocv}}{\partial SOC} \end{bmatrix},$$

$$D = -R_{ac},$$

wherein y(k+1) is the predicted terminal voltage of the battery at time k+1.

2. The method according to claim 1, wherein step (2) further comprises:

writing a terminal voltage y(k) of the second-order RC battery model of the lithium battery in a least squares form: $y(k)=\varphi(k)\theta^T+e(k)$, wherein $\varphi(k)=[y(k-1)y(k-2)I(k)I(k-1)I(k-2)]$, e(k) is a sampling error of a sensor at time k, and a parameter matrix of the second-order RC battery model of the lithium battery is identified as $\theta=[\theta_1\theta_2\theta_3\theta_4\theta_5]$, wherein $y(k)=\theta_1 y(k-1)+\theta_2 y(k-2)+\theta_3 I(k)+\theta_4 I(k-1)+\theta_5 I(k-2);$
and performing parameter identification on the parameter θ through the least squares algorithm with a forgetting factor $$\begin{cases} \hat{\theta}(k) = \hat{\theta}(k-1) + K(k)\left[y(k) - \varphi^T(k)\hat{\theta}(k-1)\right] \\ K(k) = P(k-1)\varphi(k)[\lambda + \varphi^T(k)P(k-1)\varphi(k)]^{-1} \\ P(k) = \dfrac{1}{\lambda}[I - K(k)\varphi^T(k)]P(k-1) \end{cases},$$

λ is the forgetting factor, and $\hat{\theta}$ is an estimated value of θ.

3. The method according to claim 2, wherein the model parameters $R_{ac}$, $R_{ct}$, $R_{wb}$, $\tau_{ct}$, and $\tau_{wb}$ are obtained through $$\begin{cases} R_{ac} = \dfrac{\theta_3 - \theta_4 + \theta_5}{1 + \theta_1 - \theta_2} \\ \tau_{ct}\tau_{wb} = \dfrac{T^2(1 + \theta_1 - \theta_2)}{4(1 - \theta_1 - \theta_2)} \\ \tau_{ct} + \tau_{wb} = \dfrac{T(1 + \theta_2)}{1 - \theta_1 - \theta_2} \\ R_{ac} + R_{ct} + R_{wb} = \dfrac{\theta_3 + \theta_4 + \theta_5}{1 - \theta_1 - \theta_2} \\ R_{ac}\tau_{wb} + R_{ac}\tau_{ct} + R_{ct}\tau_{wb} + R_{wb}\tau_{ct} = \dfrac{T(\theta_3 - \theta_5)}{1 - \theta_1 - \theta_2} \end{cases}$$

4. The method according to claim 3, wherein step (3) further comprises:

determining a state estimated value $\hat{x}_k^{(i)}$ of particles $x_k$ by $\hat{x}_k^{(i)} = \bar{x}_k^{(i)} + K_k^{(i)}(y_k - \bar{y}_k^{(i)})$ and determining a covariance estimation $\hat{P}_k^{(i)}$ by $\hat{P}_k^{(i)} = \hat{S}_x^{(i)}(k)\hat{S}_x^{(i)}(k)^T$, wherein $\bar{x}_k^{(i)}$ represents a one-step predicted value of the particles $x_k$, $K_k^{(i)}$ represents a Kalman gain, y(k) represents a terminal voltage of the battery, $\bar{y}_k^{(i)}$ represents a predicted output voltage value, $\hat{S}_x^{(i)}(k)$ represents a composite matrix of a predicted state error mean square matrix, k represents time, and i is a number of particles.

5. The method according to claim 4, wherein step (3) further comprises:

obtaining four square root decomposition operators through Cholesky decomposition, wherein the four square root decomposition operators are a system process noise covariance matrix, a system observation noise covariance matrix, a system prediction covariance, and a system estimation covariance;

obtaining a first-order difference matrix and a second-order difference matrix of each particle through the square root decomposition operators;

obtaining the one-step predicted value, the composite matrix of the predicted state error mean square matrix, and a composite matrix of a predicted mean square error matrix of each particle through the first-order difference matrix and the second-order difference matrix of each particle;

converting a rectangular matrix obtained from the composite matrix of the predicted state error mean square matrix into a Cholesky factor-square matrix of the predicted state error mean square matrix by using QR decomposition, updating a predicted error covariance matrix from the Cholesky factor-square matrix of the predicted state error mean square matrix;

performing the QR decomposition of composite matrix on the composite matrix of the predicted mean square error matrix to obtain a Cholesky factor-square matrix of the predicted mean square error matrix;

obtaining a mutual prediction error mean square matrix of a system from the Cholesky factor-square matrix of the predicted state error mean square matrix and the first-order difference matrix, obtaining the Kalman gain from the mutual prediction error mean square matrix of the system, updating the estimated value of the particles by the Kalman gain; and obtaining a Cholesky factor of an estimated error covariance matrix by using the QR decomposition, updating the covariance estimation by the Cholesky factor of the estimated error covariance matrix.

6. The method according to claim 5, wherein step (4) further comprises:

performing importance sampling $x_k^{(i)} \sim N(\hat{x}_k^{(i)}; \hat{P}_k^{(i)})$ on the particles by using $\hat{x}_k^{(i)}$ and $\hat{P}_k^{(i)}$ to obtain the second-order difference particle filtering (SCDPF) algorithm;

performing standardized importance weight distribution by $W_k^i = (1/\sqrt{2\pi}) \cdot e^{-(y_k - \hat{y}_k^i)^2/2}$, and performing state estimation by $\hat{x}_k = \Sigma_{i=1}^N W_k^i x_k^i$, where $\hat{y}_k^i$ is an observation value of each particle at the time k, $\hat{x}_k$ is the state estimated value of the particles at the time k, $x_k^i$ is a state value of each particle at the time k, and N represents a maximum number of particles.

7. A non-transitory computer-readable storage medium containing computer instructions stored therein for causing a computer processor to perform steps of the method according to claim 5.

8. The method according to claim 4, wherein step (4) further comprises:

performing importance sampling $x_k^{(i)} \sim N(\hat{x}_k^{(i)}; \hat{P}_k^{(i)})$ on the particles by using $\hat{x}_k^{(i)}$ and $\hat{P}_k^{(i)}$ to obtain the second-order difference particle filtering (SCDPF) algorithm;

performing standardized importance weight distribution by $W_k^i = (1/\sqrt{2\pi}) e^{-(y_k - \hat{y}_k^i)^2/2}$; and performing state estimation by $\hat{x}_k = \Sigma_{i=1}^N W_k^i x_k^i$, wherein $\hat{y}_k^i$ is an observation value of each particle at the time k, $\hat{x}_k$ is the state estimated value of the particles at the time k, $x_k^i$ is a state value of each particle at the time k, and N represents a maximum number of particles.

9. A non-transitory computer-readable storage medium containing computer instructions stored therein for causing a computer processor to perform steps of the method according to claim 8.

10. A non-transitory computer-readable storage medium containing computer instructions stored therein for causing a computer processor to perform steps of the method according to claim 4.

11. A non-transitory computer-readable storage medium containing computer instructions stored therein for causing a computer processor to perform steps of the method according to claim 3.

12. A non-transitory computer-readable storage medium containing computer instructions stored therein for causing a computer processor to perform steps of the method according to claim 2.

13. A non-transitory computer-readable storage medium containing computer instructions stored therein for causing a computer processor to perform steps of the method according to claim 1.

14. A non-transitory computer-readable storage medium containing computer instructions stored therein for causing a computer processor to perform steps of the method according to claim 1.

15. A system of lithium battery state of charge (SOC) estimation based on second-order difference particle filtering, comprising:

a second-order model building module, configured to build a second-order RC battery model of a lithium battery;

a model parameterization module, configured to perform model parameterization by using a least squares algorithm with a forgetting factor;

a density function generation module, configured to generate an importance density function through a second-order central difference Kalman filtering (SCDKF) algorithm; and an SOC estimation module, configured to improve a particle filtering algorithm according to the importance density function to obtain a second-order difference particle filtering (SCDPF) algorithm and perform SOC estimation on a lithium battery by using the SCDPF, wherein a state formula of the discretized battery second-order RC model is:

$$x_{k+1} = A \cdot x_k + B \cdot I(k)$$

$$A = \begin{bmatrix} \exp\left(-\dfrac{T}{\tau_{ct}}\right) & 0 & 0 \\ 0 & \exp\left(-\dfrac{T}{\tau_{wb}}\right) & 0 \\ 0 & 0 & 1 \end{bmatrix}, B = \begin{bmatrix} R_{ct} \cdot \left(1 - \exp\left(-\dfrac{T}{\tau_{ct}}\right)\right) \\ R_{wb} \cdot \left(1 - \exp\left(-\dfrac{T}{\tau_{wb}}\right)\right) \\ -\dfrac{T}{C} \end{bmatrix},$$

$$x_k = \begin{bmatrix} U_{ct}(k) \\ U_{wb}(k) \\ SOC(k) \end{bmatrix}, x_{k+1} = \begin{bmatrix} U_{ct}(k+1) \\ U_{wb}(k+1) \\ SOC(k+1) \end{bmatrix}$$

wherein T is a sampling time interval, k is sampling time, $R_{ac}$ is ohmic resistance, $R_{ct}$ is charge transfer resistance, $R_{wb}$ is diffusion resistance, $C_{ct}$ is charge transfer capacitance, $C_{wb}$ is diffusion capacitance, $U_{ocv}$ is a circuit open circuit voltage, $U_{ct}$ is a voltage at both terminals of a $R_{ct}C_{ct}$ network, $U_{wb}$ is a voltage at both terminals of a $R_{wb}C_{wb}$ network, $U_t$ is a voltage at a model output terminal, I is a current at present, $\tau_{ct}$ is a time constant of the $R_{ct}C_{ct}$ network, $\tau_{wb}$ is a time constant of the $R_{wb}C_{wb}$ network, $\tau_{ct}=R_{ct}C_{ct}$, $\tau_{wb}=R_{wb}C_{wb}$, and C is battery capacitance, a predicted terminal voltage of a battery after discretization is:

$$y(k+1) = C \cdot x_k + D \cdot I(k),$$

$$C = \begin{bmatrix} -1 & -1 & \dfrac{\partial U_{ocv}}{\partial SOC} \end{bmatrix}, D = -R_{ac},$$

wherein y(k+1) is the predicted terminal voltage of the battery at time k+1.

* * * * *